US012622222B2

(12) United States Patent
Uzoh et al.

(10) Patent No.: US 12,622,222 B2
(45) Date of Patent: May 5, 2026

(54) APPARATUS FOR PROCESSING OF SINGULATED DIES AND METHODS FOR USING THE SAME

(71) Applicant: Adeia Semiconductor Bonding Technologies Inc., San Jose, CA (US)

(72) Inventors: Cyprian Emeka Uzoh, San Jose, CA (US); Aaron Todd Francis, San Jose, CA (US); Gabriel Guevara, Gilroy, CA (US); Thomas Workman, San Jose, CA (US); Dominik Suwito, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 346 days.

(21) Appl. No.: 18/368,971

(22) Filed: Sep. 15, 2023

(65) Prior Publication Data

US 2024/0096683 A1     Mar. 21, 2024

Related U.S. Application Data

(60) Provisional application No. 63/407,059, filed on Sep. 15, 2022.

(51) Int. Cl.
H01L 21/683          (2006.01)

(52) U.S. Cl.
CPC .................... H01L 21/6835 (2013.01); *H01L 2221/68309* (2013.01); *H01L 2221/68313* (2013.01); *H01L 2221/68354* (2013.01)

(58) Field of Classification Search
None
See application file for complete search history.

(56) References Cited

U.S. PATENT DOCUMENTS 5,960,961 A * 10/1999 Gutentag ........... H05K 13/0084
                                                      206/716
6,375,408 B1 * 4/2002 Carter ............... H01L 21/67333
                                                      414/405

(Continued)

FOREIGN PATENT DOCUMENTS

KR          20180044375 A     5/2018

*Primary Examiner* — Khaja Ahmad
(74) *Attorney, Agent, or Firm* — HG LAW LLP

(57)          ABSTRACT

Embodiments herein are generally directed to die cleaning frames for processing and handling singulated devices and methods related thereto. The die cleaning frames may be used advantageously to minimize contact with device surfaces during post-singulation processing and to facilitate a pick and place bonding process without touching the active side of the cleaned device. Thus, the die cleaning frames and methods described herein eliminate the need for undesirable contact with clean and prepared active sides of the devices during a direct placement die-to-wafer bonding process. In one embodiment, a carrier configured to support a singulated device in a die pocket region may include a carrier plate and a frame that surrounds the carrier plate and is integrally formed therewith. The carrier plate may include a first surface and an opposite second surface, and one or more sidewalls that define an opening disposed through and extending between the first and second surfaces. Each of the sidewalls may include one or more protuberances that collectively determine a rectangular boundary of the die pocket region. Some of the protuberances may include a die supporting surface that extends beneath the die pocket region.

20 Claims, 13 Drawing Sheets

(56)                    References Cited

U.S. PATENT DOCUMENTS

| | | | |
|---|---|---|---|
| 7,097,040 B1 * | 8/2006 | Gutentag | B65D 73/02 |
| | | | 206/460 |
| 8,132,673 B1 * | 3/2012 | Gutentag | B65D 73/02 |
| | | | 206/460 |
| 2005/0077611 A1 * | 4/2005 | Ru | H01L 21/568 |
| | | | 257/703 |
| 2011/0298109 A1 | 12/2011 | Pagaila et al. | |
| 2011/0303442 A1 | 12/2011 | Chen | |
| 2015/0114695 A1 | 4/2015 | Shimizu et al. | |
| 2015/0171060 A1 * | 6/2015 | Goto | H01L 21/67 |
| | | | 438/107 |
| 2018/0182654 A1 * | 6/2018 | Uzoh | H01L 24/83 |
| 2022/0262667 A1 * | 8/2022 | Kim | H01L 21/6835 |

* cited by examiner

700C

600C

705

228

600A

Z

Y ← → X

700D

600D

707

228

600A

Z

Y ← → X

1000

1010

1015

Y

Z X

200

1005

Z

X

Y

APPARATUS FOR PROCESSING OF SINGULATED DIES AND METHODS FOR USING THE SAME

CROSS-REFERENCE TO RELATED APPLICATIONS

This application claims benefit to U.S. Provisional Application 63/407,059, filed on Sep. 15, 2022, which is incorporated by reference herein.

FIELD

The present disclosure generally relates to advanced integrated circuit (IC) packaging and, more particularly, to apparatus for concurrent processing of singulated dies and methods of using the same.

BACKGROUND

Heterogeneous integration (HI) generally refers to the incorporation of dissimilar devices into a single device package. The dissimilar devices may be of different sizes, have different functionalities, comprise different materials, or may be manufactured using different technologies. Often, adjacent devices are arranged in a face-to-face or face-to-back stack using an assembly method that forms relatively short interconnects therebetween. One such method is direct placement die-to-wafer bonding, where singulated devices are positioned face down on a wafer one by one and interconnects are formed therebetween by direct hybrid bonding.

Unfortunately, conventional methods of positioning the singulated devices have relatively high defectivity due to contamination transferred between the devices and the device handling apparatus. Such defectivity can interfere with the bonding process or cause misalignment between the devices, ultimately resulting in reduced yield and increased manufacturing costs. Further, the multiple handoffs typically required to position a device face down may be problematic for larger die, which are both more expensive and more prone to breakage from stress-induced micro-cracks.

Accordingly, there is a need in the art for improved apparatus for handling singulated devices and methods related thereto.

SUMMARY

Aspects of the disclosure are generally directed to die cleaning frames for processing and handling singulated devices and methods related thereto. The die cleaning frames may be used advantageously to minimize contact with device surfaces during post-singulation processing and to facilitate a pick and place bonding process without touching the active side of the cleaned device. Thus, the die cleaning frames and methods described herein eliminate the need for undesirable contact with clean and prepared active sides of the devices during a direct placement die-to-wafer bonding process.

In one general aspect, a carrier configured to support a singulated device in a die pocket region is provided. The carrier may include a carrier plate and a frame that surrounds the carrier plate and is integrally formed therewith. The carrier plate may include a first surface and an opposite second surface, and one or more sidewalls that define an opening disposed through and extending between the first and second surfaces. Each of the sidewalls may include one or more protuberances that extend laterally into the opening and collectively determine at least a portion of a boundary of the die pocket region. Typically, the boundary of the die pocket reaction corresponds to the size and shape of a singulated die to-be-received therein. Some of the protuberances may include a die supporting surface that extends beneath the die pocket region.

Implementations of the general aspect above may include one or more of the following features. The carrier where the frame is sized and shaped to support the carrier plate in a slot of a tape frame cassette. The carrier where the frame is compatible for use with a SEMI Standard tape frame cassette. The carrier where the carrier plate includes a rectangular array of die pocket regions. The carrier where each of the protuberances has a curved surface that collectively determine at least a portion of the boundary of the die pocket region. The carrier where the plurality of first and second protuberances collectively determine the boundary of the die pocket region. The carrier further including one or more resilient members disposed on one or more of the sidewalls, wherein each resilient member is positioned to exert a lateral force on an edge of a singulated die disposed in the die pocket region. The carrier where the first and second protuberances and the one or more resilient members collectively determine the boundary of the die pocket region. The carrier where the plurality of first and second protuberances collectively determine the boundary of the die pocket region. The carrier where each of the curved surfaces has a radius between about 0.5 mm and about 3 mm. The carrier where, between protuberances, the die pocket region is spaced apart from the sidewalls of the opening by a distance between about 0.5 mm and about 2 mm. The carrier where a combined area of the die supporting surfaces is about 5% or less than an area of the die pocket region. The carrier may include one or more alignment features that, when engaged with one or more alignment features of a substantially similar carrier, cause the die pocket regions of the carrier and the substantially similar carrier to be aligned.

In another general aspect, a first and second carrier are provided. Each of the carriers is configured to support a plurality of singulated die in an array of die pocket regions. Each of the carriers may include a carrier plate having a plurality of openings disposed therethrough, where a perimeter of each of the openings is defined by one or more sidewalls that extend between a first surface and an opposite second surface of the carrier plate. Each of the sidewalls defining an opening may include one or more protuberances that collectively define at least a portion of a boundary of a die pocket region. At least three of the protuberances that define the rectangular boundary may include a die supporting surface disposed beneath the die pocket region. Each of the carriers may include one or more alignment features that, when engaged with the one or more alignment features of the other carrier, cause the die pocket regions of the respective arrays to be aligned.

Implementations of the general aspect may include one or more of the following features. Each of the carriers may include a frame surrounding the carrier plate and integrally formed therewith, where the frame is sized and shaped to support the respective carrier in a slot of a tape frame cassette. Each of the carriers may include a frame integrally formed with the carrier plate, where the frame is compatible for use with a SEMI-Standard tape frame cassette. The first and second carriers where a curved surface of each protuberance has a radius between about 0.5 mm and about 3 mm and at least a portion of the boundary of each die pocket region is determined by lines tangent to the curved surfaces.

In another general aspect, a method of preparing a plurality of singulated devices for die-to-wafer bonding is provided. The method may include transferring a plurality of devices from a first singulated device carrier to a second singulated die carrier, each of which may include any one or combination of the features described above. Transferring the plurality of devices may include engaging one or more alignment features of the first carrier with one or more alignment features of the second carrier and inverting (flipping) the first and second carriers to transfer the plurality of devices from an array of die pocket regions in the first carrier to an array of die pocket regions in the second carrier. In some embodiments, the plurality of devices are disposed active-side down in the second carrier.

Implementations may include one or more of the following features. The method may include, before transferring the plurality of devices, while the plurality of devices are disposed in the first carrier, removing a protective layer from the active sides. The method may include, before or after transferring the plurality of devices, while the plurality devices are disposed in the first or second carrier, preparing the active sides of the devices for bonding. The method may include, after preparing the active sides of the devices for bonding, using a pick and place bonding system to transfer the devices from the first or second carrier, positioning the devices on an active-side of a substrate, and bonding the devices to the substrate. The method may include, before using the pick and place bonding system, while the devices are disposed active-side down in the array of die pocket regions, loading the first or second carrier in a SEMI standard tape frame cassette and loading the SEMI standard tape frame cassette into the pick and place bonding system. In some embodiments, the method includes receiving the plurality of devices into the first carrier. In some embodiments, the plurality of devices are received into the first carrier directly from a dicing sheet.

Figure 1:
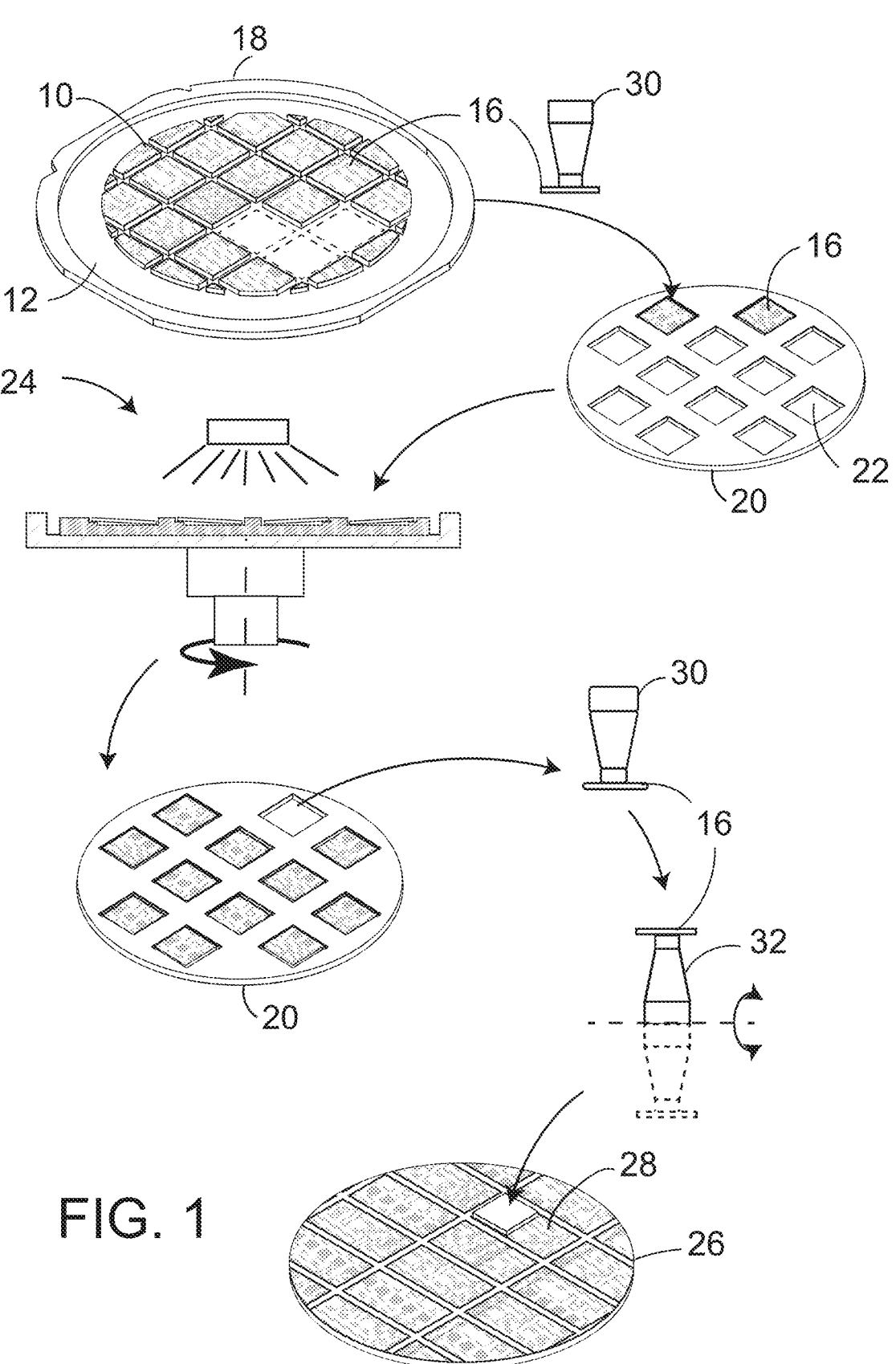
FIG. 1 schematically illustrates a conventional handling sequence from singulation to die-to-wafer bonding.

The figures herein depict various embodiments of the invention for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, article, or portion thereof that provides a base material or supporting surface used to manufacture singulated electronic devices. For example, a substrate may include "semiconductor substrates" that provide a supporting material upon which elements of a semiconductor device are fabricated or attached, and any material layers, features, and/or electronic devices formed thereon, therein, or therethrough. The term "wafer" generally refers to a semiconductor substrate used to manufacture a plurality of electronic devices, such as integrated circuits microelectromechanical systems (MEMS), sensors, and/or components thereof. The terms "singulated devices" or "singulated die" refer to one or more devices or device components that have been divided from a wafer, e.g., by use of a dicing operation. Thus, it should be noted the term "singulated" is not intended to be limited to a single device or die, as in some embodiments, the singulated device may include a plurality of stacked devices that have been divided from two or more bonded substrates, such as a stack of bonded memory devices. In some embodiments, a singulated device or singulated die may include two or more adjacent devices formed on the same substrate and divided therefrom. Unless otherwise noted, embodiments described using the term "wafer," such as "die-to-wafer bonding," are equally applicable to other processes where a singulated device is positioned on and bonded or otherwise secured face-down to a second device or another element, such as an interposer.

The singulated devices herein generally have an active side comprising semiconductor device elements, such as transistors, resistors, and capacitors, and a "backside" that is opposite the device side. The term "active side" should be understood to include a surface of the device and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "backside" (opposite the active side) includes the non-active side of the substrate at any stage of device fabrication, including the surfaces of any material layer, any feature formed thereon or extending outwardly therefrom, and/or any openings formed therein. Thus, the terms "active-side" or "backside" may include the respective surfaces of a semiconductor substrate at the beginning of device fabrication and any surfaces formed during material removal, e.g., after substrate thinning operations. Depending on the stage of device fabrication or assembly, the terms "active" and "backside" are also used to describe surfaces of material layers, temporary coatings, or features formed on, in, or through the semiconductor substrate, whether or not the material layers or features are ultimately present in the fabricated or assembled device. Generally, the term "face" refers to the to-be-bonded surface of a device, e.g., an active surface of a device as opposed to the peripheral edge surfaces that connect the active side and backside of the device.

Spatially relative terms are used herein to describe the relationships between elements, such as the relationships between apparatus, substrates, and devices. Unless the relationship is otherwise defined, terms such as "above," "over,"

"upper," "upwardly," "outwardly," "on," "below," "under," "beneath," "lower," "vertical," "horizontal," "lateral," and the like are generally made with reference to the X, Y, and Z directions in the drawings. Thus, it should be understood that the spatially relative terms used herein are intended to encompass different orientations of the apparatus, substrates, or devices and, unless otherwise noted, are not limited by the direction of gravity. For example, a device positioned "face-down" in a die pocket region includes embodiments where the active side of the device is adjacent to the carrier independent of the carrier orientation, as well as devices where the active side is facing towards the direction of gravity.

FIG. 1 schematically illustrates a conventional handling sequence for singulated devices in a die-to-wafer bonding process. As shown, the sequence begins with a singulated wafer 10, which is disposed face-up on an adhesive dicing sheet 12. In some embodiments, the wafer may be thinned prior to singulation using a combination of backgrind, etch, and/or chemical mechanical polishing (CMP) processes. In some embodiments, the wafer may include one or more features formed between the active side and the backside, such as thru-silicon vias (TSVs), or formed on or in the backside, such as conductive pads, vias, or trenches, and/or passive elements. In such embodiments, the wafer may be further processed after thinning or concurrently therewith, e.g., to form or reveal the TSVs and/or or form the backside conductive features or passive elements.

Generally, once thinned, the wafer is divided into singulated devices 16 using a dicing process. The dicing process may include coating the active side of the wafer with a protective layer, mounting the wafer face-up (active-side up) on the dicing sheet 12, and fragmenting the wafer into the singulated devices 16. The singulation process may comprise one or a combination of laser dicing, plasma dicing, chemical dicing or any other suitable method that fragments the wafer into singulated devices desired for use in subsequent processes, such as the die-to-wafer bonding processes described below. Generally, the dicing sheet 12 is secured to a wafer tape frame 18 that facilitates collective handling of the devices 16 post-singulation.

Once singulated, the devices 16 may be further processed to remove the protective layer and prepare the surfaces for bonding while the devices 16 are secured to the dicing sheet 12. Alternatively, the devices 16 may be transferred to a separate cleaning or spin plate 20. The spin plate 20 typically includes a plurality of recessed surfaces 22 or other features that maintain the plurality of singulated devices 16 in a face-up orientation for further processing. For example, the spin plate 20 may be used to hold the singulated devices during subsequent processing operations 24, where the active sides of the devices 16 are cleaned and prepared for bonding. Generally, at least some contamination of the backside surface of the devices 16 is to be expected with use of the spin plate 20. Such contamination may include particulates or residues, e.g., protective layer residues, that accumulate between the recessed surfaces 22 and the backside of the devices 16 during the cleaning processes.

Once the surfaces are cleaned and prepared, the devices 16 may be aligned with and positioned on a second substrate, e.g., wafer 26, which comprises a second plurality of (pre-singulated) devices 28. Positioning the first devices 16 may include individually transferring each device 16 from the spin plate 20, inverting or flipping the device 16, and aligning and placing the first device on a corresponding second device 28 of the second wafer 26. Each first device 16 may be transferred to and from the spin tray by use of an end effector 30 (e.g., a vacuum nozzle) that directly contacts the active side of the device 16. The device may then be inverted using a flipping tray (not shown) or through direct handoff to a second end effector 32. The second end effector 32 contacts the backside surface of device 16 and positions the device 16 face-down on the second wafer 26. As shown, the process and handling sequence require undesirable contact between the end effectors 30, 32 and the clean and prepared device surfaces. Such contact contributes to the transfer of contaminants back and forth between end effectors 30, 32, and device surfaces that introduce defects to the bonding interface, interfere with device positioning and alignment, and ultimately suppress device yield.

Figure 2A:
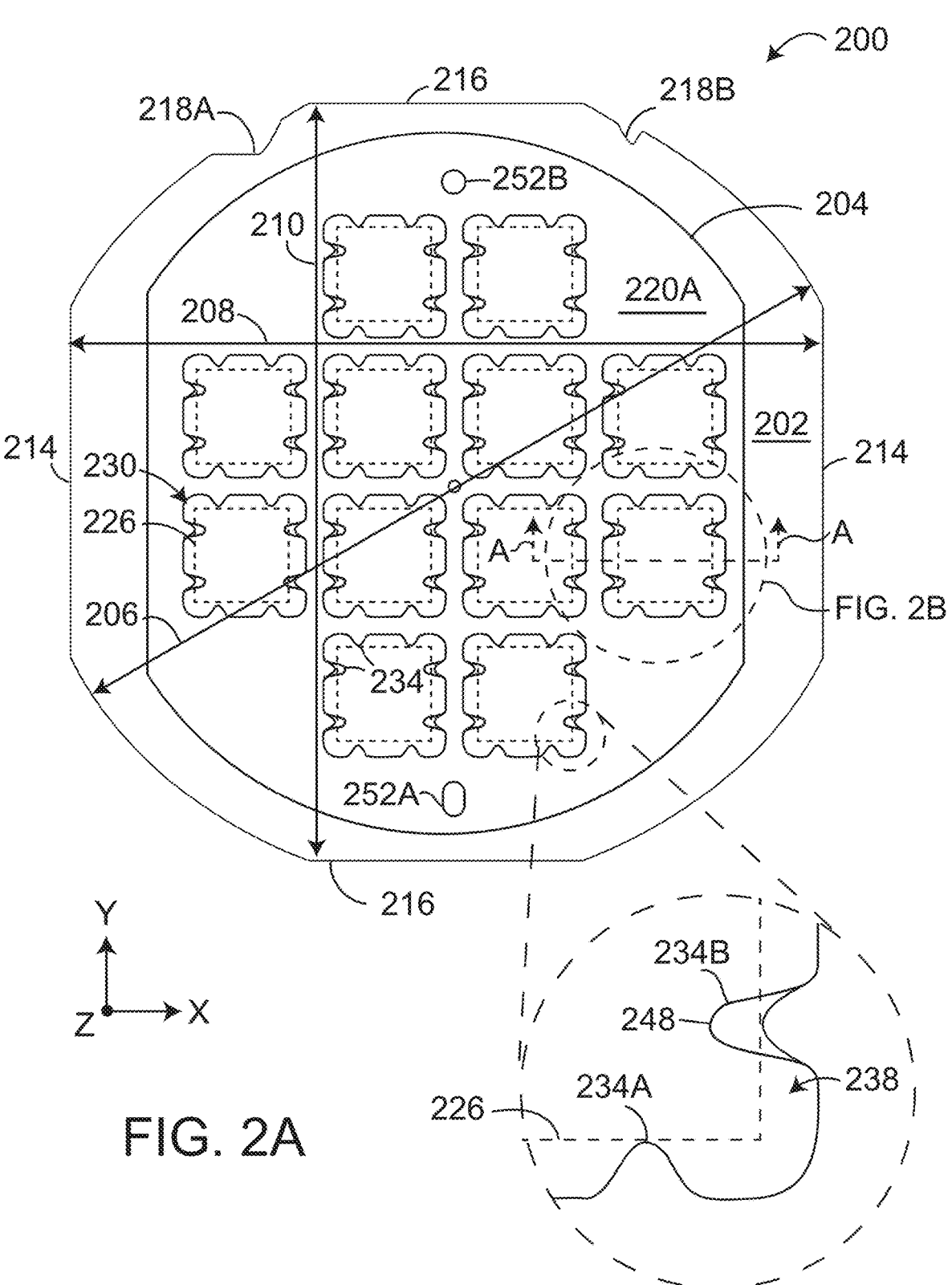
FIG. 2A is a schematic plan view of a singulated die carrier, in accordance with example embodiments of the disclosure.
Figures 2B, 2C:
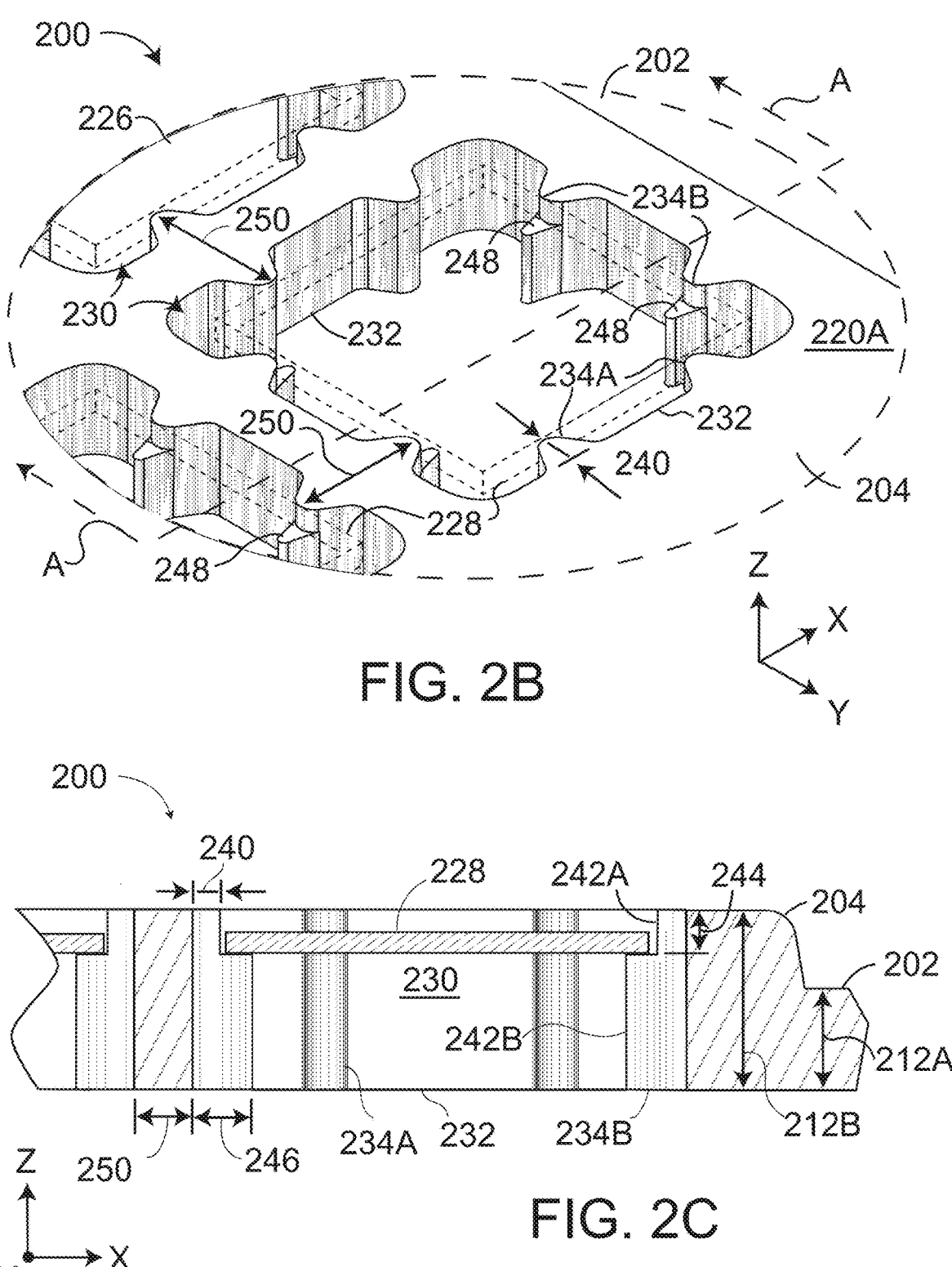
FIG. 2B is a close-up isometric view of a portion of the die carrier of FIG. 2A.
FIG. 2C is a close-up sectional view of a portion of a die carrier, taking along line A-A of FIG. 2B.

FIGS. 2A-C schematically illustrate a singulated die carrier 200 that may be used to reduce defectivity and yield loss associated with conventional die handling and processing methods, such as the processing sequence described in FIG. 1. For example, the carrier 200 may be used in combination with the methods below to substantially reduce or eliminate the accumulation of contaminates on device backside surfaces, eliminate the need for contact events with unprotected active sides, and reduce the overall number of contact events with either the active or backside surfaces.

Generally, the carrier 200 includes a frame portion 202 and a plate portion 204 disposed radially inward of the frame portion 202. Here, the frame portion 202 may have a size and shape that is substantially similar to a wafer tape frame of the type typically used to support a substrate in a wafer singulation process, such as the wafer tape frame 18 of FIG. 1. For example, as shown, the frame portion 202 has an outer diameter 206, a width 208 extending in the X direction, a width 210 in the Y direction, and a thickness 212A (FIG. 2C). Generally, the thickness 212A is between about 0.5 mm and about 2 mm, such as about 1 mm, or about 1.5 mm.

Similar to the tape frame of FIG. 1, a top portion of frame portion 202 may include one or more asymmetric notches 218A and 218B that may be used to position the carrier 200 (and the singulated die 228 disposed therein) in a desired orientation. Here, the widths 208, 210 are each less than the outer diameter 206, where the width 208 is the distance between parallel straight portions 214 on the sides of the frame perimeter, and the width 210 is the distance between parallel straight portions 216 at the top and bottom of the perimeter. In some embodiments, the straight portions 214 support the frame portion 202 when the carrier 200 is disposed in a wafer frame cassette, such as the wafer frame cassette 1005 shown in FIG. 10B.

In some embodiments, one or more aspects of the frame portion 202 may be formed according to an industry standard for wafer tape frames, such as available from the trade association SEMI® North America, headquartered in Milpitas, California. For example, in some embodiments, one or more aspects of the frame portion are formed according to SEMI G74, SEMI G87, and/or SEMI G88 standards, each of which are incorporated herein by reference. In some embodiments, the carrier 200 is compatible for use with a SEMI standard frame cassette, such as a cassette in compliance with SEMI G77, SEMI G92, and/or a SEMI standard FOUP, such as a FOUP in compliance with SEMI E185, each of which is incorporated herein by reference.

Figures 3, 4:
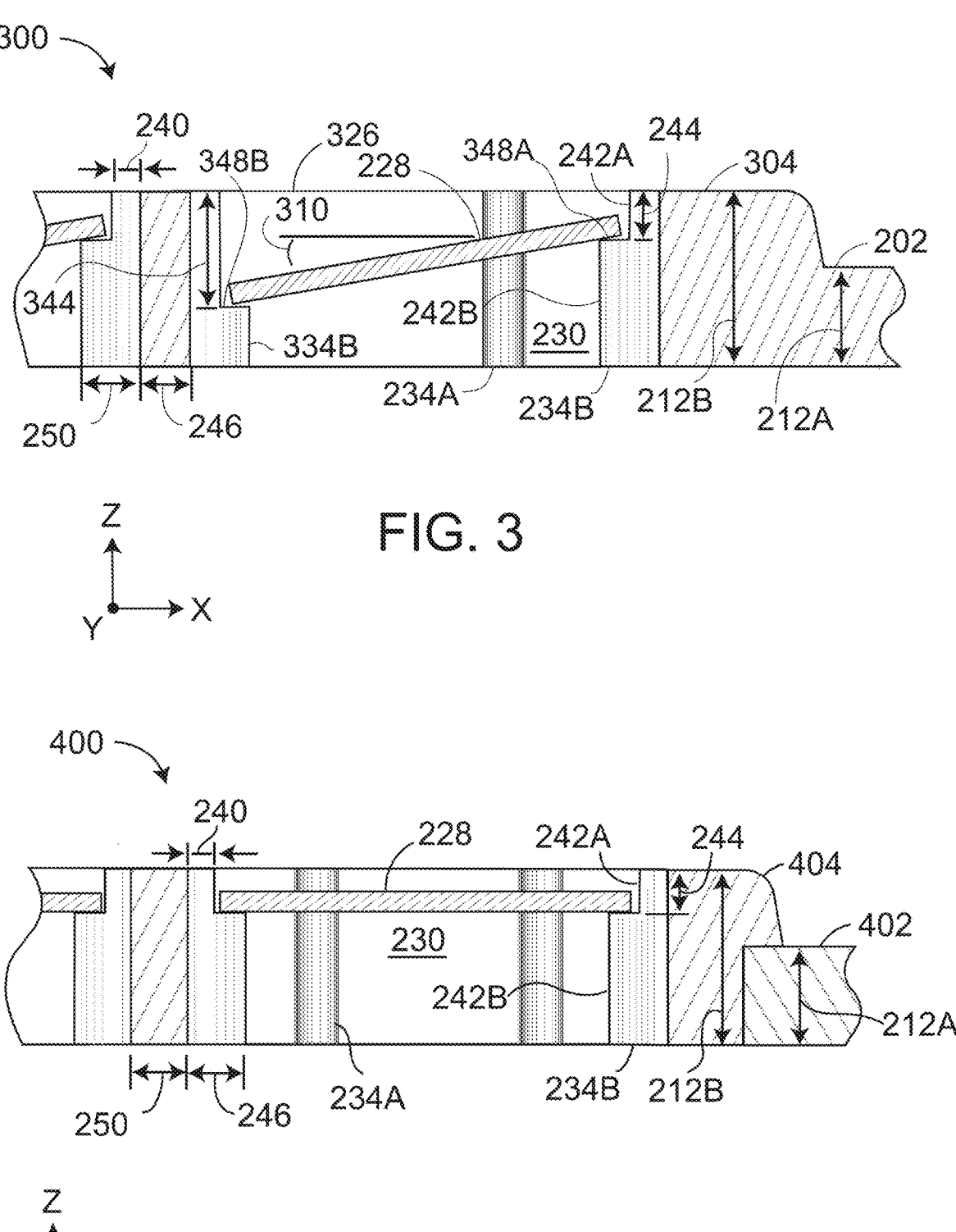
FIGS. 3-4 are schematic sectional views of a portion of a singulated die carrier, in accordance with example embodiments of the disclosure.

The plate portion 204 is disposed radially inward of the frame portion 202 and includes a first surface 220A and an opposite second surface 220B (FIG. 4). Generally, the plate portion 204 has a uniform thickness 212B, so that the first and second surfaces 220A, 220B are substantially parallel to one another across their respective X-Y planes. In some embodiments, such as shown in FIG. 2C, the plate portion 204 and frame portion 202 are formed so that the first surface 220A of the plate portion 204 extends upwardly from a first surface 220A of the frame portion 202 and a second surface 220B of the plate portion 204 is substantially coplanar with a second surface 220B of the frame portion 202.

Here, the plate portion 204 includes a plurality of die pocket regions 226 formed in the first surface 220A, where each die pocket is configured to support a singulated die 228. Each pocket region 226 occupies a portion of an opening 230 that extends through the plate portion 204 to the second surface 220B. As shown, each of the openings 230 is defined by a plurality of sidewalls 232 (four shown) that form a generally rectangular shape when viewed from the Z-direction. Each sidewall 232 includes one or more protuberances 234 that extend outwardly from adjacent portions of the sidewall 232 and into opening 230. Here, the generally rectangular shape corresponds to a generally rectangular singulated die 228 to-be-received in the die pocket region 226. In other embodiments, each of the openings 230 may be defined by any number of sidewalls 232 that form any desired opening shape, such as polygonal shapes, including non-rectangular quadrilateral shapes, curved shapes including circular, elliptical, convex or concave arc shapes, irregular shapes, or combinations thereof. Generally, when the opening is defined by a continuous sidewall, such as for circular or elliptical shaped openings, the sidewall will comprise at least three protuberances.

Generally, each protuberance 234 extends laterally into the opening 230 so that the perimeter of a die disposed therein is spaced apart from portions of the sidewalls 232 by at least a corresponding gap 238. Here, each of the protuberances 234 is disposed between two adjacent corners of the opening 230 so that the gap 238 extends around the corner of each die 228. Beneficially, the gap 238 allows cleaning fluids to flow between the edges of the die 228 and the sidewalls 232, which substantially reduces or eliminates contaminants from accumulating in those regions.

Typically, the plurality of protuberances 234 include a plurality of first protuberances 234A and a plurality of second protuberances 234B. The first protuberances 234A may have substantially the same sectional shape throughout the thickness 212B (when viewed from the Z-direction). In some embodiments, each first protuberance 234A comprises a curved surface (when viewed from the Z-direction) than extends laterally into the opening by a distance 240, where the distance 240 is measured from portions of the sidewalls adjacent to the protuberance. In some embodiments, the distance 240 is between about 0.5 mm and about 3 mm, such as about 1.5 mm, and the curved surface has a radius about between about 0.5 mm and about 3 mm, such as between about 0.5 mm and 1.5 mm, such as about 1 mm.

Generally, each second protuberance 234B has a first portion 242A that spaces the die 228 away from the sidewalls 232 and a second portion 242B that supports the die 228 in the pocket region 226. The first portion 242A may have the same sectional shape as the first protuberance 234A, and extends downwardly from the first surface 220A, towards the second surface 220B, by the distance 244. The second portion 242B extends downwardly from the first portion 242A to the second surface 220B, and laterally into the opening 230 by a distance 246. Here, the distance 246 is greater than the distance 240 so that the second portion 242B forms a ledge that at least partially extends beneath the die pocket region 226. Here, the portion of the ledge disposed beneath the pocket region 226 forms a die supporting surface 248.

Typically, each opening 230 includes a plurality of die supporting surfaces 248, for example, at least three die supporting surfaces 248, where two or more die supporting surfaces 248 are disposed on a first side of the opening 230, and one or more die supporting surfaces 248 (two shown) are disposed on an opposite second side of the opening 230. In some embodiments, the die supporting surfaces 248 are disposed on at least three sides of the opening 230 or on each of four sides of the opening 230. As described above, the first and second protuberances 234A-B define the boundary or at least a portion of the boundary of the die pocket region 226, where the size and shape of the die pocket region 226 corresponds to the size and shape of a singulated die 228 to-be-received therein. For example, in some embodiments each lateral dimension of the die pocket region 226 is substantially the same as a lateral dimension of a to-be-received singulated die plus about 5 mm or less, such as plus about 4 mm or less, 3 mm or less, 2 mm or less, or about 1 mm or less. In some embodiments, the die supporting surfaces 248 are recessed from the first surface 220A by about the thickness of the to-be-received singulated die 228 plus about 0.5 mm or more, 1 mm or more, or plus about 2 mm or more.

Here, the plurality of openings 230 are disposed in a rectangular array and are spaced apart from one another by a distance 250 in each of the X and Y directions, where the distance 250 comprises a portion of the plate portion 204 disposed between the sidewalls 232 of the openings 230. In some embodiments, the distance 250 is between about 0.5 mm and about 4 mm, such as between about 1 mm and 3 mm, or about 2 mm. In some embodiments, such as shown in FIGS. 2A-2C, the sidewalls 232 may be substantially perpendicular to the surfaces 220A, 220B of the plate portion 204 so that the distance 250 is substantially uniform in the thickness direction (Z-direction). In other embodiments, the sidewalls 232 may be sloped or stepped so that the distance 250 changes between the first surface 220A and the second surface 220B. In some embodiments, the transitional edge between the sidewalls 232 and one or both of the surfaces 220A, 220B may be rounded or chamfered (not shown).

Typically, the number and relative locations of the die pocket regions 226 within an array corresponds to the number of relative locations of die in a post-singulation wafer prior to separation from the dicing tape. Thus, the die pocket regions 226 may be assigned numbers or coordinates and thus can be mapped to a singulated wafer so that the known good die from the singulated wafer can be more easily tracked across multiple processing operations for processing and quality control purposes.

Here, the carrier 200 further includes a plurality of alignment features, shown here as a first alignment feature 252A and a second alignment feature 252B spaced apart from the first alignment feature 252A. The alignment features 252A, 252B may be used to facilitate die transfer from carrier 200 to a substantially similar second carrier without the need for undesirable contact with the surfaces of the die, as further described in relation to FIGS. 5-6 and the methods below.

In the example illustrated in FIGS. 2A-2C, each of the die supporting surfaces 248 is recessed from the surface 220A so that a die 228 disposed in the opening 230 is supported in a substantially horizontal orientation, i.e., parallel to the surface 220A. In some embodiments, one or more die supporting surfaces may be recessed from the surface 220A by different distances so that the die 228 is held in a sloped position, such as illustrated in FIG. 3.

FIG. 3 illustrates a portion of a carrier 300 having a plurality of die pocket regions 326 each configured to support a singulated die in a sloped orientation. Here, the die pocket region 326 includes one or more second protuberances 234B having a first die supporting surfaces 348A disposed on the first side of the opening 230 and one or more third protuberances 334B having a second die supporting surfaces 348B disposed on an opposite second side of the opening 230.

The first die supporting surfaces 348A may be substantially similar to the die supporting surfaces 248 described above and are recessed from the first surface 220A by the distance 244. The second die supporting surfaces 348B may be recessed from the first surface 220A by a second distance 344, e.g., between about 2 mm and 3 mm, which is different from the distance 244 so that a die disposed on the die supports slopes upward and away from the second die support surface 348B toward the first die support surface 348A. In some supports, the plate portion 304 is configured to hold the die at an angle 310 of between about 10° and 30° relative to the first surface 220A, where the die is sloped upwardly and away from a radially inward position toward a radially outward position of the plate portion 304.

Typically the carriers described herein are formed of one or more chemically and plasma-resistant rigid materials, such as a chemically resistant metal or metal alloys, glass, ceramic, polymer, or combinations thereof. In some embodiments, the carrier may be formed of a stainless steel alloy, a metal oxide or metal nitride ceramic material, e.g., alumina or aluminum nitride, or a chemically resistant fluoropolymer. In some embodiments, the carrier material may be coated with a protective layer, the protective layer may comprise of suitable polymeric material or materials, glass, ceramic or glass-ceramic layer. For example, the carrier may be formed of a metal or metal alloy, e.g., aluminum, an aluminum alloy, or a stainless steel alloy and coated with a chemically resistant protective layer comprising glass, ceramic, a glass-ceramic composite, and/or a polymer, such as a fluoropolymer. In the examples described above, the frames and plates of each carrier are integrally formed from portions of a unitary body of material, such as a stainless steel sheet, or from bodies of the same or different materials separately manufactured and joined together.

FIG. 4 shows an example carrier 400 comprising a separable frame portion 402 and plate portion 404. The plate portion 404 may include any one or combination of the features described above in relation to the plate portions 204, 304 and further includes one or more features that allow the plate portion 404 to engage with and be supported by the frame portion 402. For example, the carrier plate may include a recessed lip on the second surface 220B that forms a mating surface with a radially inward surface of the frame portion 402. It is contemplated that the plate portion 304 may be used in combination with SEMI standard tape frames, such as the tape frame described in FIG. 1.

In some embodiments, devices are loaded into the carriers using a pick and place process. Typically, the active-side surface of the device is coated with one or more material layers, e.g., water-soluble coatings and/or resist-based masking layers, that protect the device surface and facilitate the dicing process but are incompletable with die-to-wafer bonding. Thus, such material layers are removed, and the device surfaces are prepared for bonding in one or more post-singulation processing operations, as described below. Beneficially, the carriers described above can be used to process the singulated devices in a face-up or face-down orientation with minimum contact between the carrier and device surfaces. The carriers further allow for inverting (flipping) the device surfaces without direct contact therewith and are generally compatible for use with SEMI Standard tape frame cassettes and systems configured to handle SEMI Standard tape frames. Thus, the carriers may be used to minimize/substantially eliminate contact with the cleaned and prepared bonding surface and the yield loss associated therewith.

Figure 5:
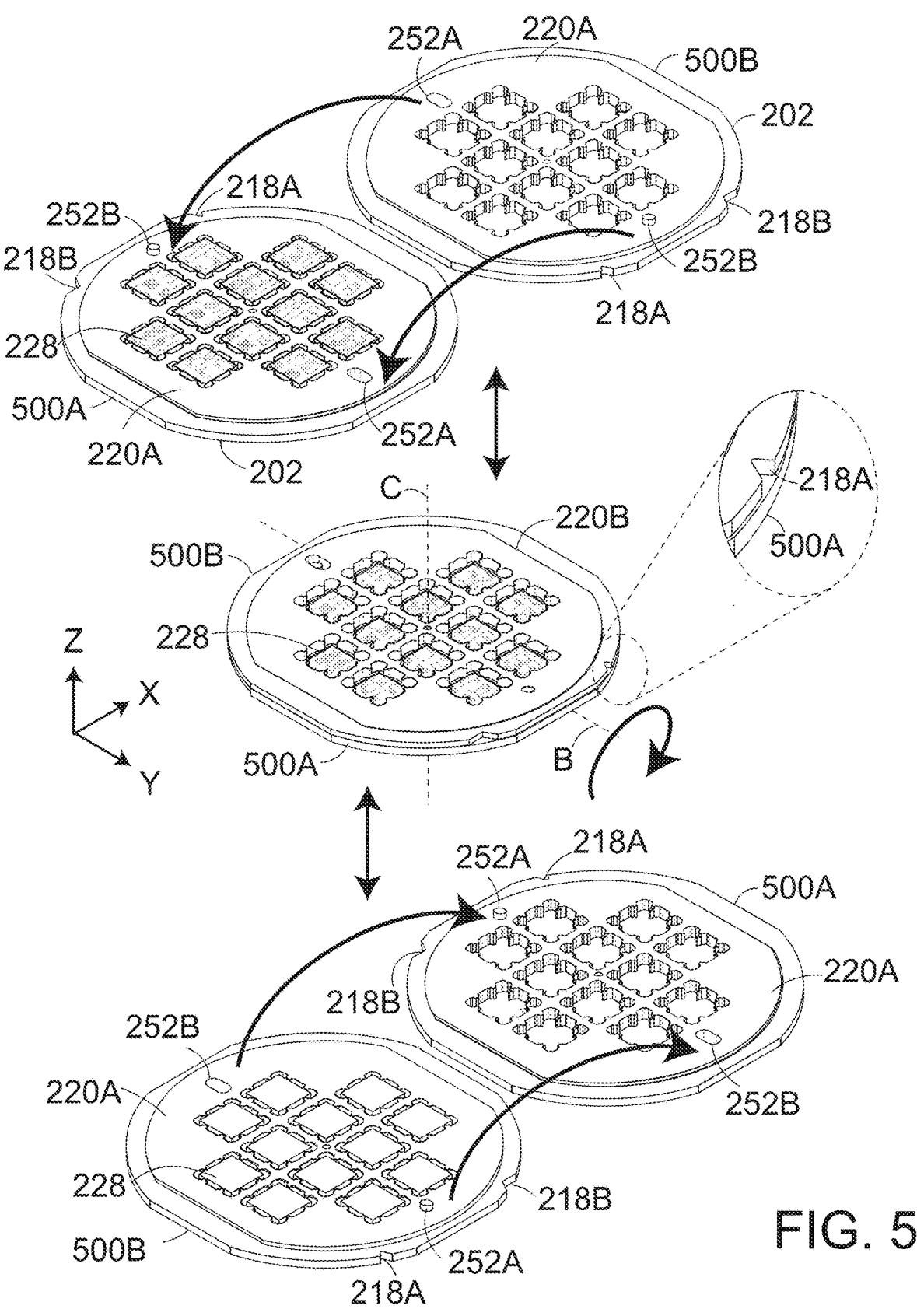
FIGS. 5-6 schematically illustrate aspects of the methods set forth herein.

FIG. 5 illustrates the transfer of a plurality of devices between a first carrier 500A and a second carrier 500B where each of the carriers 500A, 500B is substantially the same as the other and may include any one or combination of the features of the carriers described above. As used here, "substantially the same" indicates the first and second carriers 500A, 500B are manufactured to the same specifications so that differences therebetween typically comprise only normal manufacturing variation. Generally, each of the carriers 500A, 500B includes a plurality of alignment features formed in or on the first surface 220A of the plate portion 204. In FIG. 5, a first alignment feature 252A includes an opening formed in the surface 220A, and a second alignment feature 252B includes a post extending upwardly from the surface 220A.

Transferring the dies 228 between the first and second carriers 500A-B includes engaging the first alignment feature 252A of each carrier with the second alignment feature 252B of the other carrier. As shown, the second carrier is rotated 180° around the center axis C when the alignment features are engaged. The first and second carriers 500A-B may then be inverted (flipped) about the axis B, which transfers the plurality of dies 228 therebetween. Transferring the plurality of dies 228 inverts the orientation (flips) of the devices with respect to the die pocket regions 226, e.g., from face-up to face-down or vice versa. Thus, the first and second carriers 500A-B may be used to position the devices face-down prior to pick and place bonding without undesirable contact with the cleaned and prepared surfaces.

Figure 6:
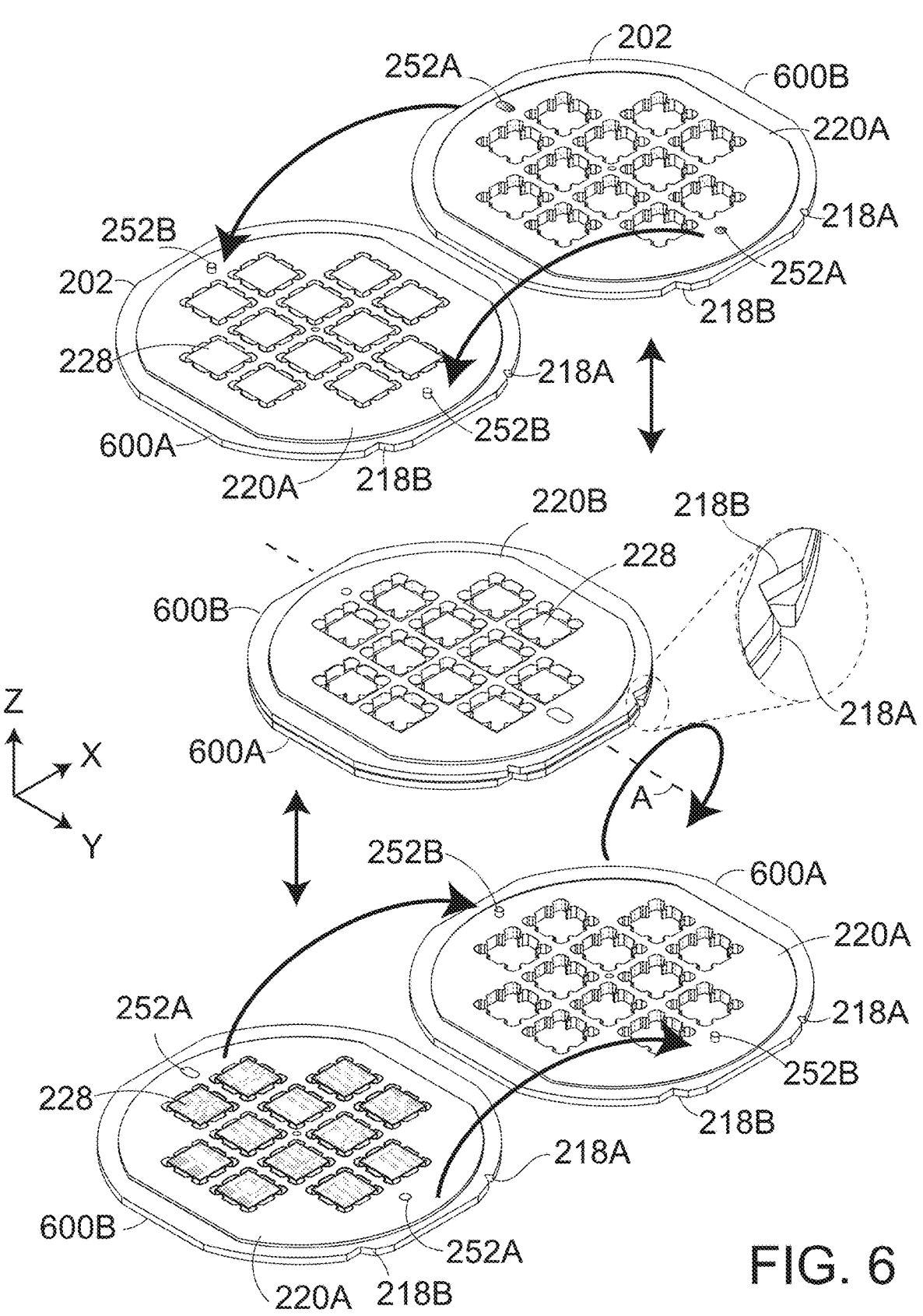

FIG. 6 illustrates the transfer of devices between a first carrier 600A and a second carrier 600B, each configured for use with the same devices. Here, the first and second carriers 600A, 600B have different types of alignment features, e.g., the first carrier comprises one or more first alignment features 252A, e.g., posts, and the second carrier comprises one or more second alignment features 252B, e.g., openings configured to engage with the first alignment features 252A, but are otherwise substantially the same. In other embodiments, the first and second carriers 600A-B may have additional differences, such as the thickness of the plates, size of the openings, depth of the die pocket regions and/or slope of the devices disposed therein, number and location of protuberances, and/or number and location of die supporting surfaces. In some embodiments, the respective frame portions of the first and second carriers may be mirrors of one another so that the asymmetric orientation notches 218A-B are aligned when the carriers are engaged, making the stacked carriers suitable for use in conventional tape frame handling systems.

Figures 7A, 7B:
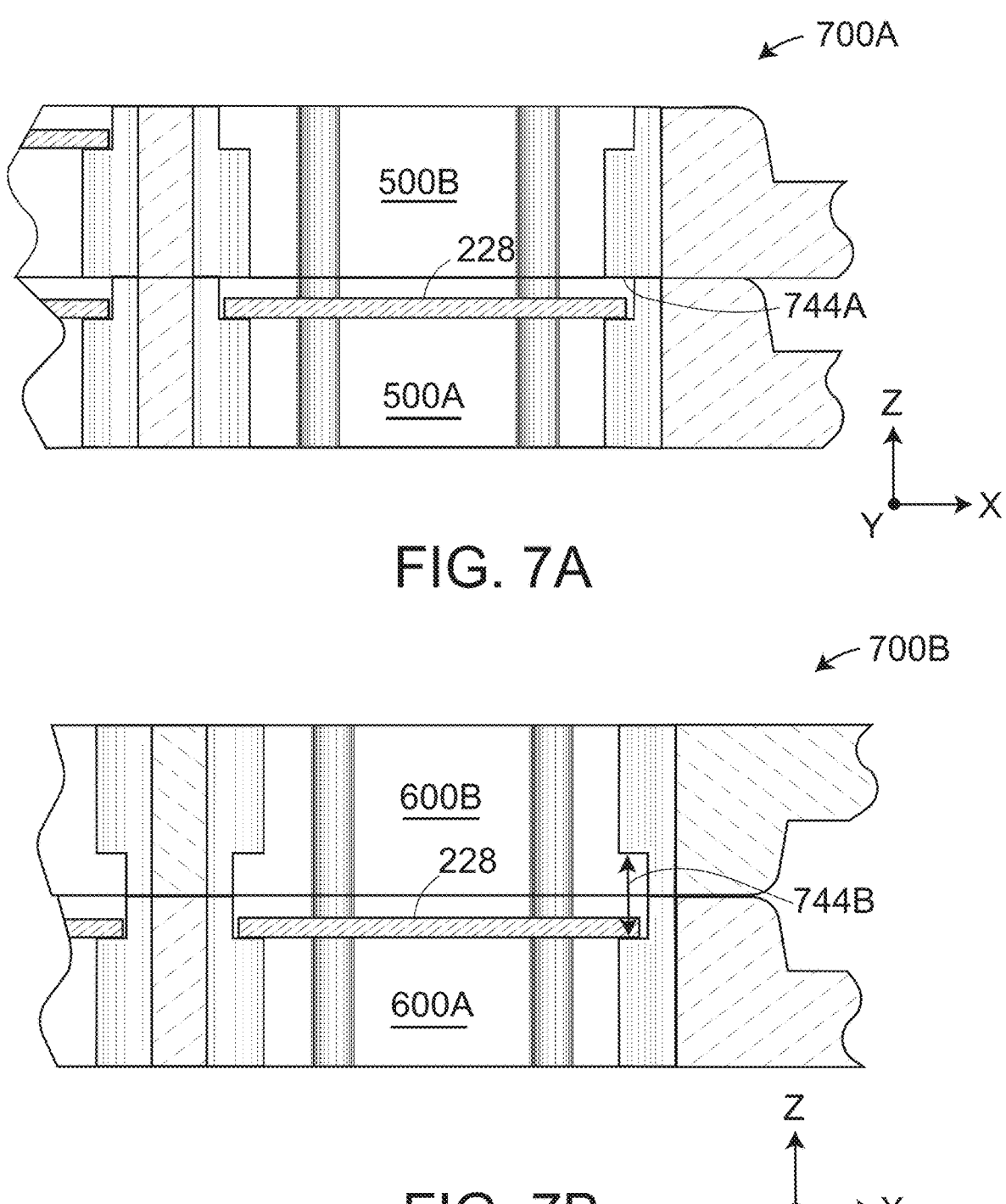
FIGS. 7A-7D are schematic sectional views for carrier assemblies, in accordance with example embodiments of the disclosure.

In some embodiments, it may be desirable to process the devices using a carrier assembly, such as illustrated in FIGS. 7A-D. In FIG. 7A, a carrier assembly 700A comprises a first carrier 500A and a second carrier 500B disposed on the first carrier 500A in a back-to-face configuration. Here, the second carrier 500B provides an upper boundary 744A for the pocket regions 226 of the first carrier 500A, where the upper boundary 744A is determined by the lower surfaces of the second protuberances 234B.

In FIG. 7B, a carrier assembly 700B comprises a first carrier 600A and a second carrier 600B, where the first and second carriers 600A, 600B are disposed in a face-to-face configuration. Here, the pocket regions 226 of each carrier are aligned to provide a combined height 744B of 2 times the depth of each individual pocket region 226, e.g., 2× the distance 244 (shown in FIG. 2C). In some embodiments, the frame portions 202 of each carrier are configured so that the asymmetrical orientation notches 218A-B (FIG. 2A) are aligned when the respective carriers 500A-B or 600A-B are assembled in the desired back-to-face or face-to-face configuration.

Figure 7C:
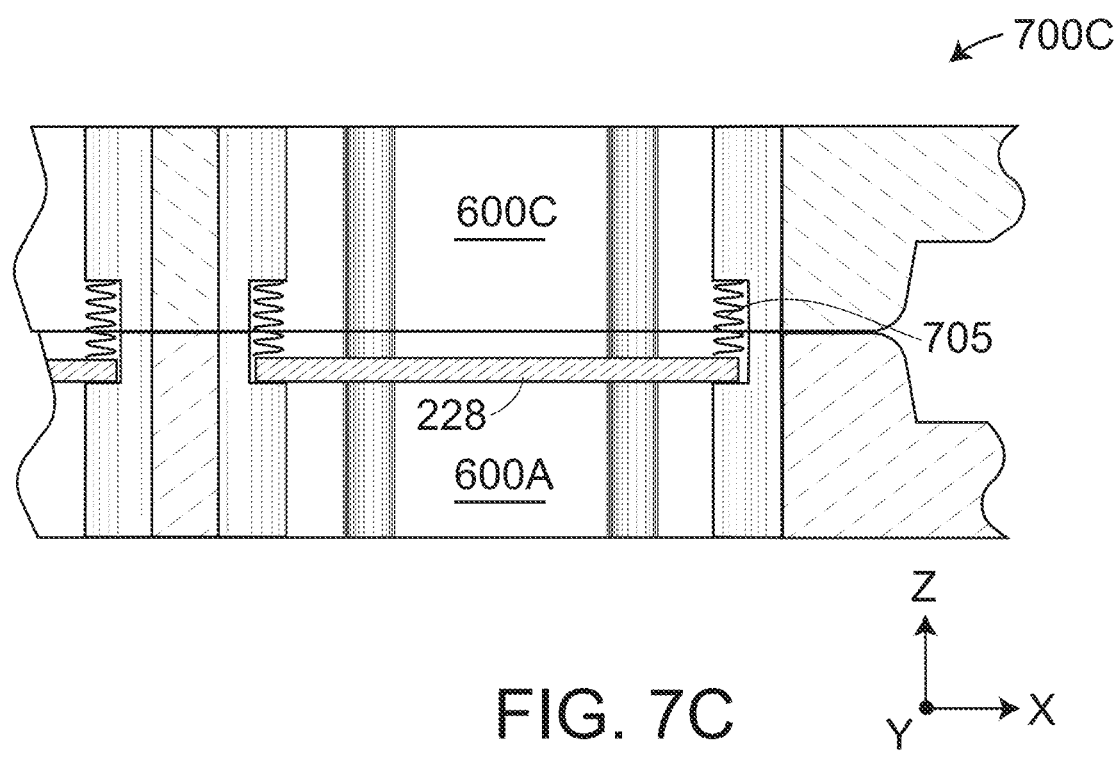
Figure 7D:
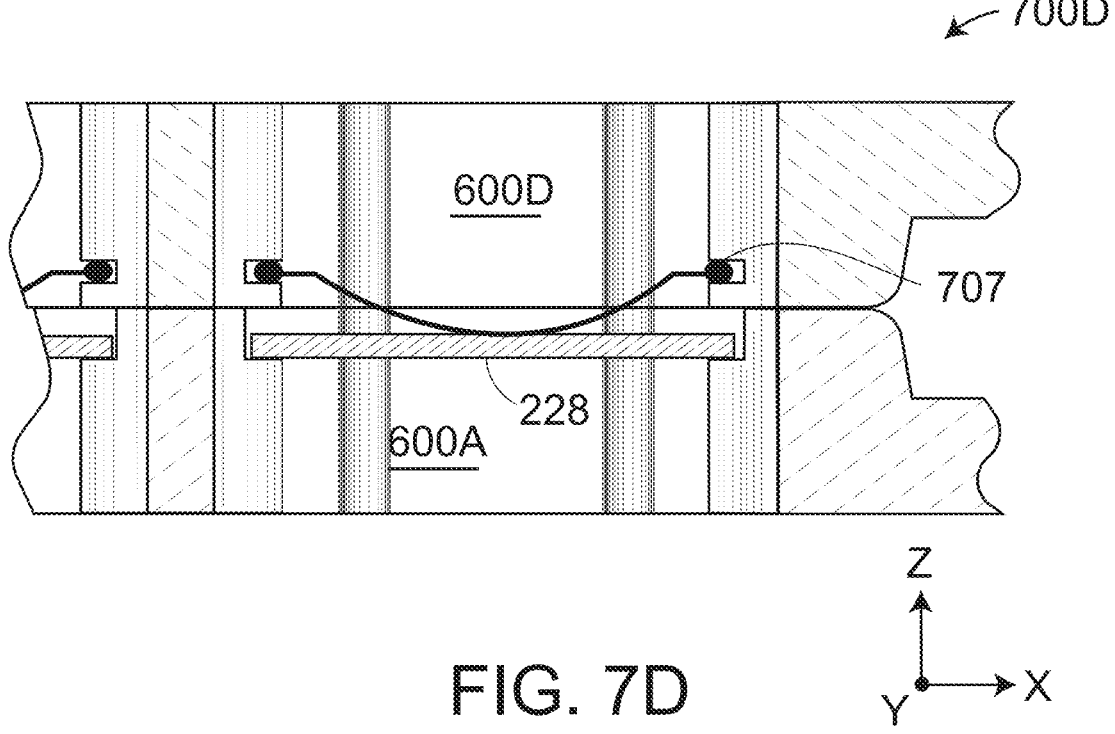

In FIGS. 7C-7D, the respective carrier assemblies 700C-D each comprises a first carrier 600A and a second carrier 600C or 600D, where the second carrier 600C-D is similar to carrier 600B as described above and further includes one or more resilient members 705 or 707, disposed in the respective die pocket regions. In FIG. 7C, the resilient member 705 comprises a helical compression spring disposed opposite of the die supporting surface 248 of the first carrier 600A. The resilient member 705 may abut, i.e., be positioned directly adjacent to, the backside of the singulated die 228 and exert a force thereagainst to secure and hold the die 228 in the die pocket region of the first carrier 600A. Thus, the resilient member may be used to prevent die chipping due to movement of the die 228 within the pocket region 226 In FIG. 7D, the resilient member 707 may comprises a tension spring, such as a spider spring, a leaf spring, or a bow spring (as shown).

Figure 7E:
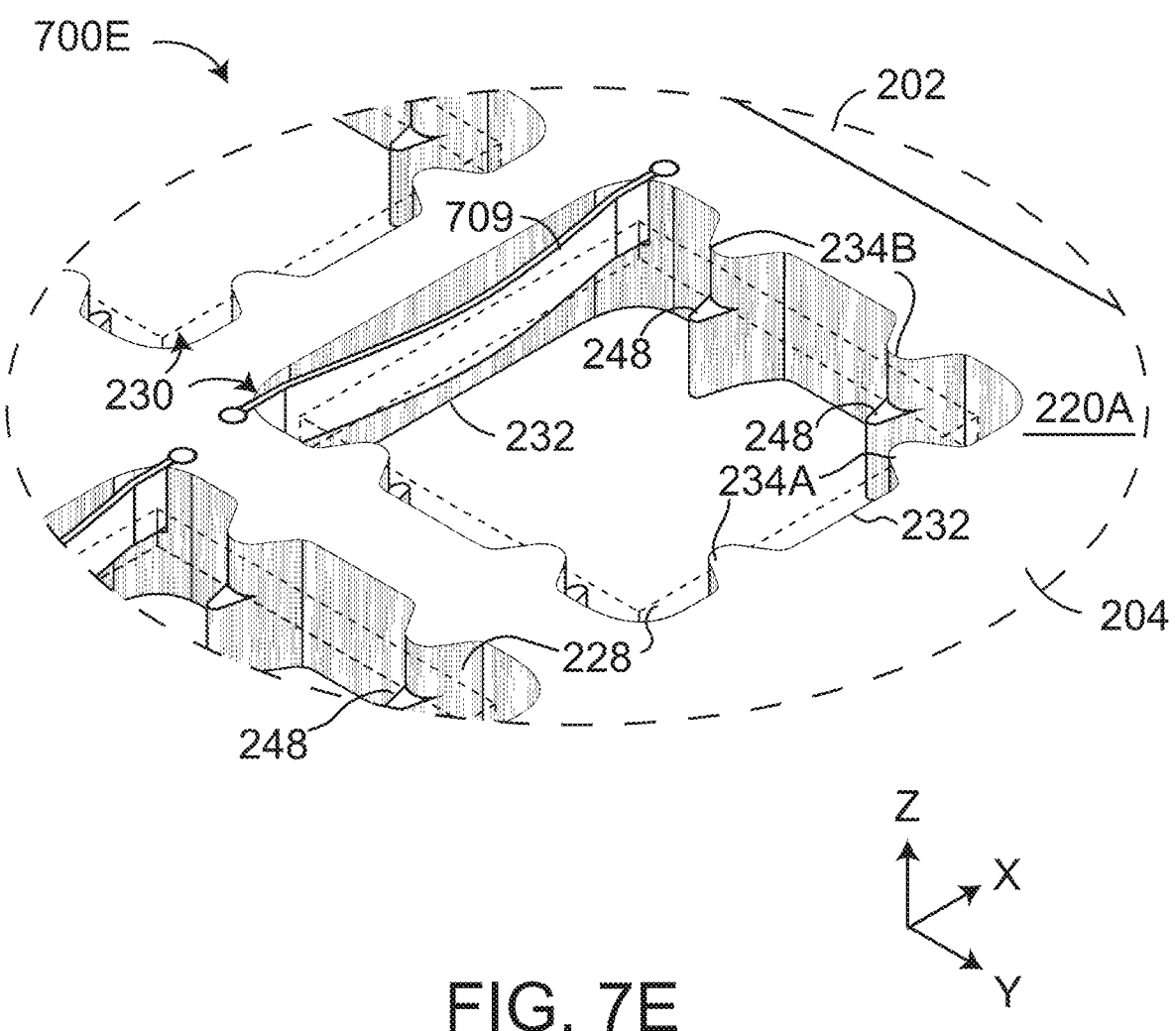
FIG. 7E is a schematic isometric view of a portion of a die carrier, in accordance with an example embodiments of the disclosure.

FIG. 7E is a schematic isometric view of a carrier 700E configured secure a die 228 within a die pocket region 226 without the use of a second carrier. Here, the carrier 700E may include any one or combination of the features of the carriers described above and further includes one or more resilient members 709 (one shown), such as a tension spring, e.g., a spider spring, a leaf spring, or a bow spring. As shown, the resilient member 709 is positioned to exert a lateral force (i.e., in the X-Y plane) on an edge of the singulated die 228 (shown in phantom). The one or more resilient members 709 may be disposed on and/or fastened to any one or more sidewalls 232 between the first and second protuberances 234A-B and/or in place of one or more of the first and second protuberances 234A-B. In some embodiments, resilient members 709 may be used in place of the first portion 242A (FIG. 2C) of one or more second protuberances 234B. Typically, the resilient member 709 is compressed during loading and unloading of the die 228 into the die pocket region 226, e.g., by use of a end effector of a handling system. Beneficially, the lateral force exerted on one or more edges of the die 228 by the one or more resilient members 709 secures and holds the die 228 in the die pocket region 226 to prevent movement thereof during subsequent processing. By preventing movement of the die during processing, the one or more resilient members 709 may be beneficially used to substantially reduce or eliminate undesirable die chipping due to die movement within the die pocket region 226.

Each of the carriers 500A-B, 600A-B or carrier assemblies 700A-D described above may be used to process a plurality of singulated devices in one or more operations prior to die-to-wafer bonding. In one example, a plurality of known good singulated dies 228 are secured face-up or face-down in corresponding known locations on the first carrier 500A, 600A, and the dies are further secured in place with the attachment of a second carrier, 500B or 600B-D. The singulated die 228 are cleaned with suitable recommended solvent or solvents to strip protective coating on the dies 228. The cleaning process may include rinsing the dies with deionized (DI) water and spin drying the carrier or carriers to dry the cleaned dies 228. Depending on applications, the cleaned dies 228 may be further exposed to a plasma or plasma effluent (e.g., effluent of a remotely-generated plasma) to further strip unwanted organic residues of the cleaned dies. In some embodiments, exposing the dies to the plasma or plasma effluent may comprise an ashing operation, e.g., to remove a resist material from the die surfaces. After the ashing operation, the dies 228 may be rinsed with DI water or other suitable solvent and dried, e.g., in the presence of a drying gas, such as nitrogen or clean dry air (CDA).

In some embodiments the dies 228 may be exposed to a nitrogen-containing plasma or plasma effluent to activate the bonding surface or surfaces of the dies 228. In some embodiments, the plasma or plasma effluent may comprise ionized water vapor. Generally, the activated bonding surface of the dies are rinsed and dried prior to the die bonding operation. If the dies are processed using a carrier assembly 700A-D, the second carrier 500A-B or 600B-D is typically separated from the first carrier 500A or 600A before the first carrier 500A or 600A is loaded in a pick and place bonder. A handler of the bonder, such as a die picking head, then picks up the cleaned die 228 from the backside thereof and positions the die on the surface of a prepared wafer or other substrate. In direct bonding applications, the dies 228 and wafer or other substrate may each comprise a prepared bonding surface and direct bonds are formed therebetween on contact. In other embodiments, the die may be bonded to the wafer or substrate using other suitable methods, e.g., solder bump arrays with surface topography.

Figure 8:
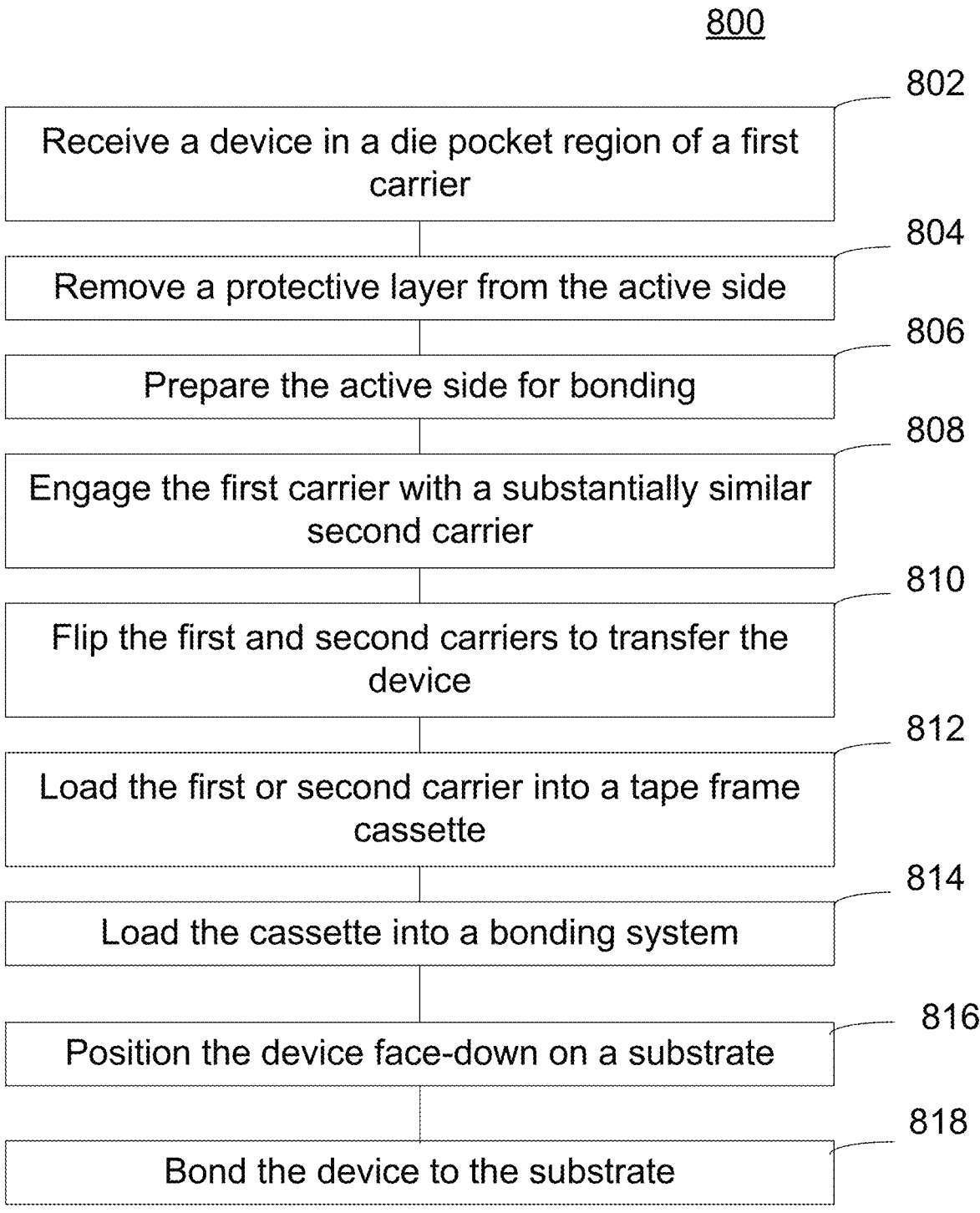
FIG. 8 is a block diagram illustrating a device packaging method using the carriers described herein, in accordance with example embodiments of the disclosure.

FIG. 8 is a flow diagram of an example method 800 that may be performed using one or more of the singulated device carriers described above. At block 802, method 800 includes receiving a plurality of devices in an array of die pocket regions of a first carrier. In some embodiments, receiving the devices includes transferring the devices from a singulated wafer disposed on a dicing sheet. The devices may be transferred to the first carrier individually, e.g., by use of a pick and place and/or flipper system, and may be positioned in either a face-up or face-down orientation. In some embodiments, the devices may be transferred directly from the dicing sheet, e.g., by aligning the singulated wafer with the first carrier before releasing the devices from the dicing sheet. In those embodiments, the devices may be received into the first carrier in a face-down orientation.

At block 804, method 800 may include cleaning the device surfaces. Here, cleaning the device surfaces may include exposing the devices to a cleaning solution and/or a plasma to remove one or more material layers therefrom. In some embodiments, the one or more material layers comprise protective coatings and/or resist layers used to protect the devices and facilitate singulation thereof. The devices may be retained in the first carrier, a second carrier after device transfer thereto (e.g., at block 808), or an assembly of the first and second carrier during one or more cleaning operations and may be processed in a face-up or face-down orientation. For example, in some embodiments, the plurality of devices may be processed in a single carrier or in a carrier assembly with the active sides disposed face-down with respect to the carrier and/or with respect to gravity. Advantageously, the methods and carriers herein allow for simultaneous processing of the active and backside surfaces so that separate cleaning operations with the devices in different orientations may not be needed, though they may still be performed if desired.

At block 806, method 800 may include preparing the devices for direct bonding. Typically, preparing the devices for direct bonding includes smoothing the surfaces to a desired surface roughness prior to singulation, such as between 0.1 to 3.0 nm RMS, activating the surfaces to weaken or open chemical bonds in a dielectric material, and terminating the surfaces with a desired species. Smoothing the surfaces may include polishing the active surface of the pre-singulated wafer using a chemical mechanical polishing (CMP) process. Activating and terminating the surfaces may include exposing the surfaces to radical species formed in a plasma before singulation and/or after cleaning at block 804. In some embodiments, the plasma is formed using a nitrogen-containing gas, e.g., $N_2$, and the terminating species includes nitrogen and hydrogen. In some embodiments, the surfaces may be activated using a wet cleaning process, e.g., by exposing the surfaces to a dilute aqueous ammonia solution and/or a non-aqueous tetramethyl ammonium hydroxide solution. In some embodiments, the aqueous ammonia solution is used for direct dielectric bonding applications and the tetramethyl ammonium hydroxide solution is used for hybrid direct dielectric and direct metal, e.g., copper, bonding applications.

At blocks 808 and 810, method 800 may include transferring the devices between the first and second carrier. Block 808 includes engaging the first carrier with the second carrier, and block 810 includes inverting the first and second carriers to transfer the plurality of devices therebetween. Transferring the plurality of devices inverts the devices within the respective array of die pocket regions, i.e., flips the devices from a face-up to a face-down orientation or vice versa. Typically, the plurality of devices are positioned in a face-down position within the die pocket regions prior to the bonding process, e.g., before or after one or more cleaning operations or before or after preparing the surfaces for bonding. The devices may then be positioned on a wafer or substrate for bonding without contacting the clean and prepared surfaces with a die-handling end effector, such as a vacuum nozzle of the pick and place bonding system.

At blocks 812-814, method 800 may include bonding the devices to a wafer or other substrate in a die-to-wafer direct bonding scheme. For example, at blocks 812 and 814, method 800 may respectively include loading the first or second carrier in a tape frame cassette, such as the SEMI-standard tape frame cassette described below, and loading the cassette into a pick and place bonding system. Typically, the devices are disposed face down, e.g., with respect to gravity, in the die pocket regions of the first or second carrier.

At blocks 816 and 818, method 800 may respectively include positioning the plurality of devices face-down on a wafer or other substrate and bonding the plurality of devices thereto. Positioning the devices on the wafer typically may include using an end effector of the bonding system to engage the backside of the devices (disposed face down in the die pocket regions), and aligning the devices with desired devices formed on the wafer. In some embodiments, the bonding system is configured to bond the plurality of devices to the wafer using a direct dielectric or direct hybrid bonding technology, such as ZiBond® and/or DBI®, each of which is commercially available from Adeia Holding Corp., San Jose, CA, USA.

It should be noted that implementations of method 800 are not limited to the arrangement shown in FIG. 8, as aspects may be performed independently or in combination with any other aspects. It is also contemplated that the aspects described above may be performed in any practicable order and/or concurrently with other aspects.

It is contemplated that one or more of the processing operations described above may be performed using a system conventionally configured to process singulated wafers prior to separation from the dicing sheet, either individually or in batches. For example, in some embodiments, one or more of the post-singulation processing operations may be performed using processing systems conventionally configured for individual wafer tape frame handling, such as the processing system 900 of FIG. 9A. In another example, the carrier or carrier assemblies may be used in a batch processing system 1000, such as shown in FIG. 10A. In some embodiments, the batch processing system 1000 may be configured to concurrently process a plurality of carriers or carrier assemblies disposed in a tape frame cassette 1005, such as shown in FIG. 10B.

Figure 9A:
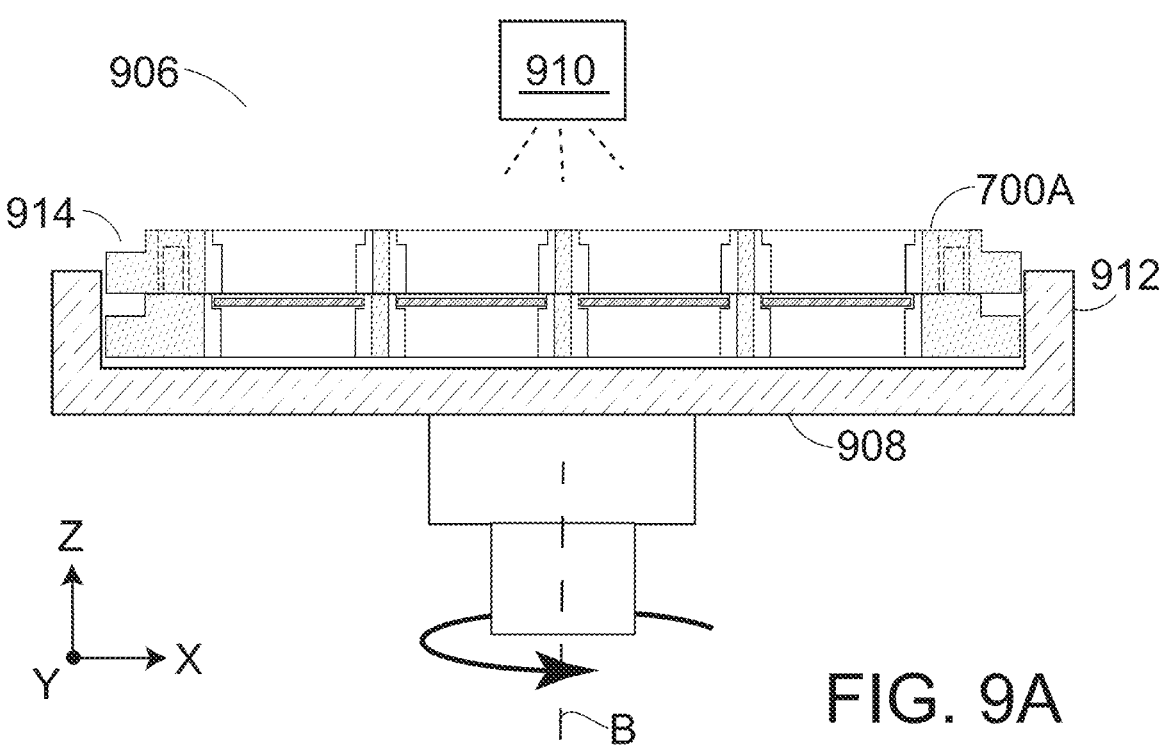
FIGS. 9A-9B, 10A-10B, and 11 schematically illustrate processing systems and apparatus that may be used to perform the methods herein.
Figure 9B:
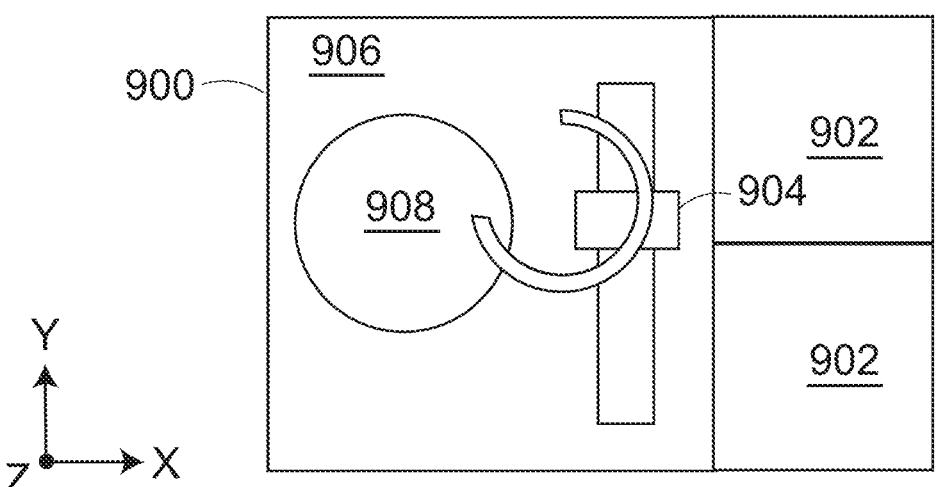
Figure 10A:
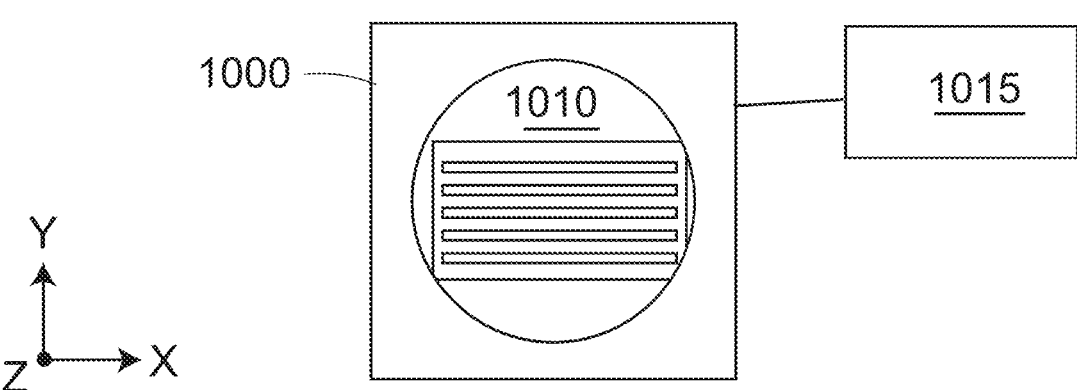
Figure 10B:
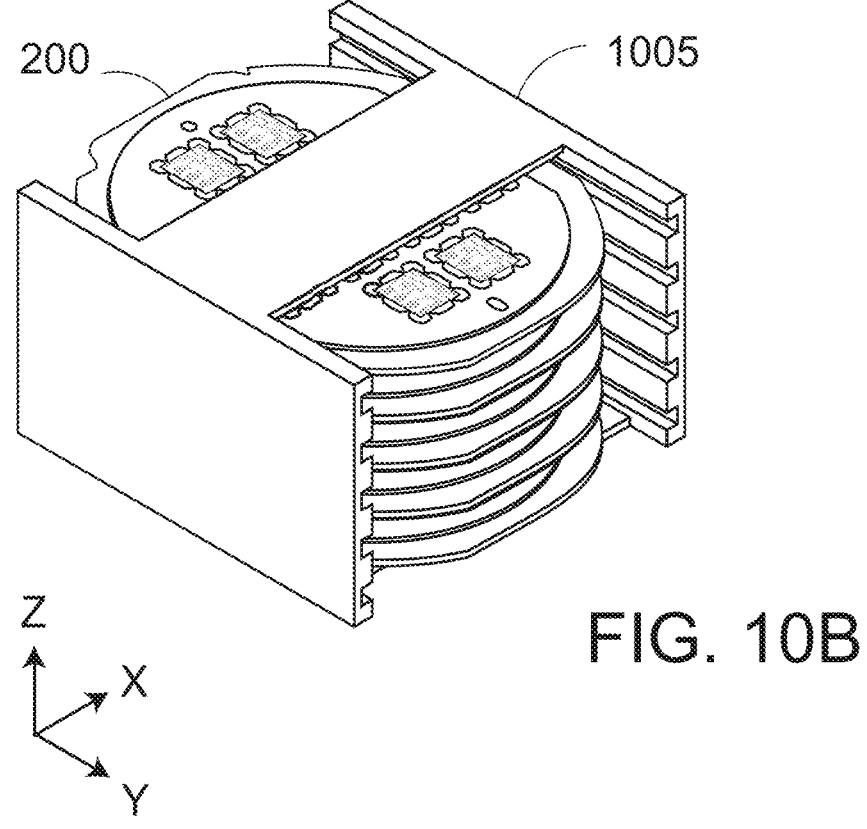

FIG. 9A is a schematic side sectional view of a portion of the processing system 900 that may be used to perform aspects of method 800. FIG. 9B is a schematic plan view of the processing system 900 shown in FIG. 9A. In some embodiments, the processing system 900 is configured for processing individual wafer tape frames (and singulated wafers and a dicing sheet secured thereto) and may include a tape frame loading station 902 (FIG. 9A), a tape frame handler 904, e.g., a robot with an end effector, and a wet or dry (e.g., plasma) processing region, such as the processing region 906. The processing region 906 may be used to clean the devices by removing one or more material layers therefrom and/or prepare the device surfaces for bonding. Here, the processing region 906 is configured for wet processing and includes a support 908 and a fluid dispenser 910, e.g., a spray nozzle or showerhead, disposed over the support 908.

The support 908 typically includes one or more features for securing a conventional wafer tape frame during processing, e.g., pins or a frame configured to engage with the asymmetrical notches 218A and 218B (FIG. 2A). Here, the support 908 is rotatable about an axis D while cleaning fluids are concurrently dispensed from the fluid dispenser 910 disposed thereover. In some embodiments, the support 908 may include one or more sidewalls 912 that form a fluid container 914 or vessel. In some embodiments, the processing system 900 is used to clean or prepare devices disposed in a carrier assembly, such as the carrier assembly 700A described above. Here, the carrier assembly 700A is disposed on the support 908 and at least partially disposed within the container 914. As described above, the carrier assembly 700A provides an upper boundary to the pocket regions 226 in order to retain the plurality of die 228 therein during processing. For example, the second assembly 700A may be used to prevent the die 228 from being flung outwardly from the pocket regions 226 by centrifugal forces imparted by the rotating support 908, e.g., during a spin-rinse-dry (SRD) operation. In some embodiments, the system 900 may be used to process the devices without the use of a second carrier.

FIG. 10A is a schematic representation of a batch processing system 1000 that may be used to perform one or more aspects of method 800. FIG. 10B is a schematic isometric view of a tape frame cassette 1005 that may be used with the processing system 1000. In some embodiments, the cassette 1005 is a SEMI standard tape frame cassette, such as described above. Here, the processing system is configured for dry processing and includes a processing region 1010 and a plasma source 1015, shown here as a remote plasma source (RPS) fluidly coupled to the processing region 1010. However, it is contemplated that aspects of method 800 may also be performed using a batch system configured for wet processing, e.g., where the system includes a fluid dispenser, such as shown in FIG. 9A.

Figure 11:
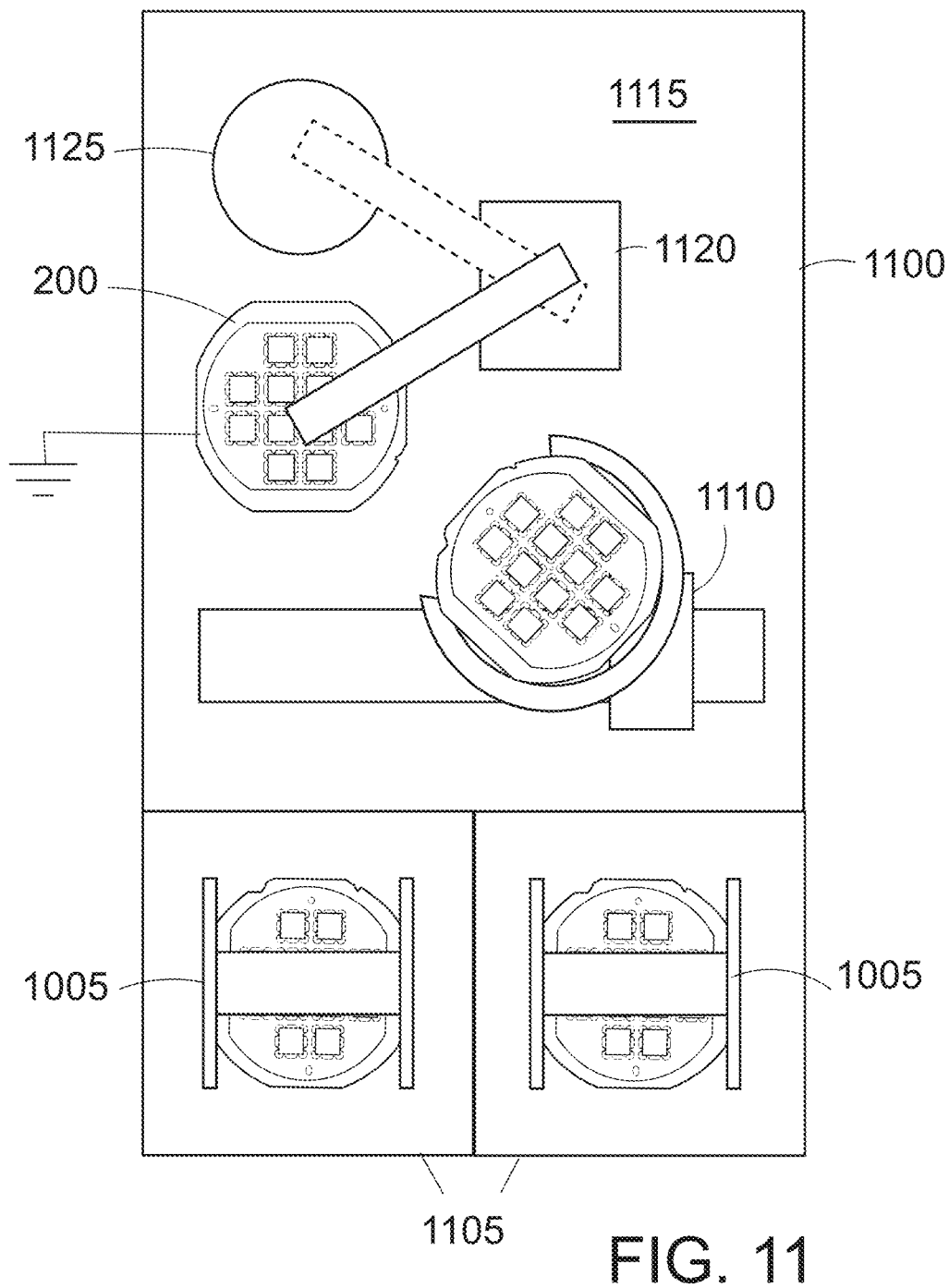

FIG. 11 is a schematic representation of a pick and place bonding system 1100 that may be used to perform one or more aspects of method 800. Here, the bonding system 1100 includes one or more cassette loading stations 1105, a first handler 1110 for transferring a carrier 200 from the loading station 1105 to a bonding station 1115, and a second handler 1120 for picking face-down oriented devices from the carrier 200 and positioning the devices on a wafer 1125 or other substrate. In some embodiments, the carrier 200 is coupled to ground during processing to prevent an accumulation of static energy on device surfaces, which may interfere with the pick and place and/or bonding process. Typically, the carriers 200 are loaded into loading stations 1105 using a SEMI-standard cassette 1005, such as described above.

The embodiments discussed above are intended to be illustrative and not limiting. One skilled in the art would appreciate that individual aspects of the apparatus and methods discussed herein may be omitted, modified, combined, and/or rearranged without departing from the scope of the described embodiments. Only the claims that follow are meant to set bounds as to what the claimed subject matter includes.

What is claimed is:

1. A carrier configured to support a singulated die in a die pocket region disposed between a first surface and an opposite second surface of a carrier plate, the carrier plate comprising:

one or more sidewalls that define an opening disposed through and extending between the first and second surfaces, wherein:

one or more of the sidewalls comprises one or more first or second protuberances that extend laterally into the opening;

the first and second protuberances collectively determine at least a portion of a boundary of the die pocket region;

the boundary of the die pocket region corresponds to the size and shape of a singulated die to-be-received therein; and each of the second protuberances comprises a die supporting surface that extends beneath the die pocket region.

2. The carrier of claim 1, wherein the first and second protuberances collectively determine the boundary of the die pocket region.

3. The carrier of claim 1, further comprising:

a frame surrounding the carrier plate and integrally formed therewith, wherein the frame is sized and shaped to support the carrier plate in a slot of a tape frame cassette.

4. The carrier of claim 1, further comprising:

a frame integrally formed with the carrier plate, wherein the frame is compatible for use with a SEMI Standard tape frame cassette.

5. The carrier of claim 1, wherein the carrier plate comprises a rectangular array of die pocket regions.

6. The carrier of claim 1, wherein an area of the die pocket region is determined by the size of a rectangle that will fit between curved surfaces of the plurality of first and second protuberances.

7. The carrier of claim 6, wherein each of the curved surfaces has a radius between about 0.5 mm and about 3 mm.

8. The carrier of claim 1, wherein between protuberances, the die pocket region is spaced apart from the sidewalls of the opening by a distance between about 0.5 mm and about 2 mm.

9. The carrier of claim 1, wherein a combined area of the die supporting surface is about 5% or less than an area of the die pocket region.

10. The carrier of claim 1, further comprising one or more resilient members disposed on one or more of the sidewalls, wherein each resilient member is positioned to exert a lateral force on an edge of a singulated die disposed in the die pocket region.

11. The carrier of claim 10, wherein the first and second protuberances and the one or more resilient members collectively determine the boundary of the die pocket region.

12. The carrier of claim 1, further comprising one or more alignment features that when engaged with one or more alignment features of a substantially similar carrier cause the die pocket region of the carrier and the substantially similar carrier to be aligned.

13. A first carrier and a second carrier each configured to support a plurality of singulated die in an array of die pocket regions, the first and second carriers each comprising:

a carrier plate having a plurality of openings disposed therethrough; and one or more alignment features, wherein each of the openings is defined by one or more sidewalls that extend between a first surface and an opposite second surface, each of the sidewalls comprises one or more protuberances that extend laterally into a respective opening to collectively determine a boundary of a die pocket region, the boundary of the die pocket region corresponds to the size and shape of a singulated die to-be-received therein, at least three of the protuberances comprises a die supporting surface disposed beneath the die pocket region, and when engaged with the one or more alignment features of the other carrier, the alignment features cause the die pocket regions of the respective arrays to be aligned.

14. The first and second carriers of claim 13, each further comprising:

a frame surrounding the carrier plate and integrally formed therewith, wherein the frame is sized and shaped to support the respective first or second carrier in a slot of a tape frame cassette.

15. The first and second carriers of claim 13, each further comprising:

a frame integrally formed with the carrier plate, wherein the frame is compatible for use with a SEMI-Standard tape frame cassette.

16. The first and second carriers of claim 13, wherein a curved surface of each protuberance has a radius between about 0.5 mm and about 3 mm, and the boundary of each die pocket region is determined by lines tangent to the curved surfaces.

17. The first and second carriers of claim 13, wherein the carrier plate of the first or second carrier comprises one or more resilient members disposed in each of the plurality of openings, and the one or more resilient members are each positioned to exert a force against a singulated die disposed in a respective die pocket region of the other carrier.

18. The first and second carriers of claim 17, wherein the resilient member comprises a spring.

19. The first and second carriers of claim 13, wherein between protuberances, the die pocket region is spaced apart from the sidewalls of the opening by a distance between about 0.5 mm and about 2 mm.

20. The first and second carriers of claim 13, wherein a combined area of the die supporting surface is about 5% or less than an area of the die pocket region.

\* \* \* \* \*